United States Patent [19]
Sunada et al.

[11] Patent Number: 5,258,328
[45] Date of Patent: Nov. 2, 1993

[54] METHOD OF FORMING MULTILAYERED WIRING STRUCTURE OF SEMICONDUCTOR DEVICE

[75] Inventors: Takeshi Sunada, Ichikawa; Yasukazu Mase, Fujisawa, both of Japan

[73] Assignee: Kabushiki Kaisha Toshiba, Kawasaki, Japan

[21] Appl. No.: 31,324

[22] Filed: Mar. 15, 1993

[30] Foreign Application Priority Data

Mar. 16, 1992 [JP] Japan .................................. 4-55954
Mar. 25, 1992 [JP] Japan .................................. 4-66819

[51] Int. Cl.$^5$ ........................................ H01L 21/461
[52] U.S. Cl. .................................... 437/195; 437/228; 437/246; 437/189
[58] Field of Search ............... 437/195, 189, 228, 246; 156/631, 634, 644; 257/758

[56] References Cited

U.S. PATENT DOCUMENTS

| | | | |
|---|---|---|---|
| 4,758,306 | 7/1988 | Cronin et al. | 156/643 |
| 4,876,212 | 10/1989 | Koury | 437/34 |
| 5,169,802 | 12/1992 | Yeh | 437/195 |
| 5,189,506 | 2/1993 | Cronin et al. | 257/752 |

*Primary Examiner*—T. N. Quach
*Attorney, Agent, or Firm*—Finnegan, Henderson, Farabow, Garrett & Dunner

[57] ABSTRACT

A conductive film is formed on first and second prospective lower wiring layer formation regions on a semiconductor substrate and a prospective isolation region between the lower wiring layers. An insulating interlayer is formed on the semiconductor substrate including this conductive film and is partially removed to obtain an opening in which the conductive film is exposed. In addition, an upper wiring layer is formed on the upper surface of the semiconductor substrate. The conductive film and an upper wiring portion located on the conductive film are simultaneously and selectively removed to obtain isolated upper layer portions and isolated conductive film portions. Alternatively, two wiring portions each having at least two lower wiring portions electrically insulated from each other and adjacent to each other are formed on a semiconductor substrate having a stepped portion, and an insulating interlayer is formed thereon. The insulating interlayer is removed until the first and second wiring portions are exposed. In addition, the stepped portion formed in the second wiring portion is buried with a third insulating film. A method of forming a highly reliable multilayered wiring structure at a high yield can be obtained.

16 Claims, 22 Drawing Sheets

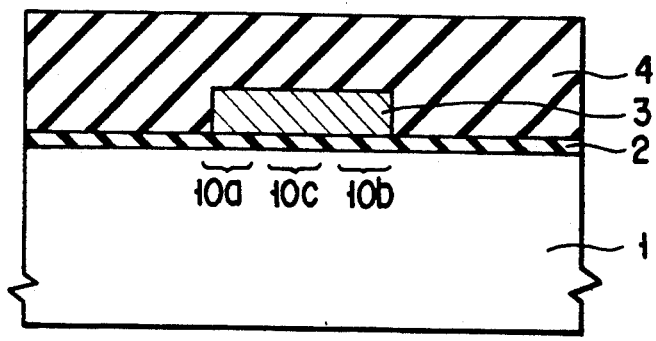
F I G. 4A
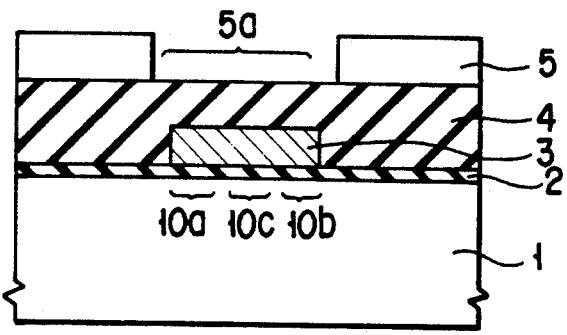
F I G. 4B
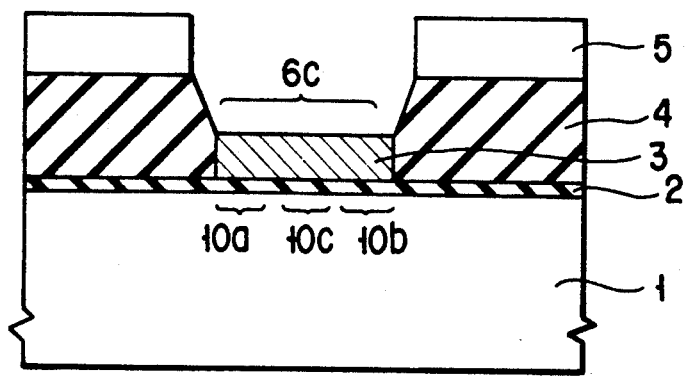
F I G. 4C

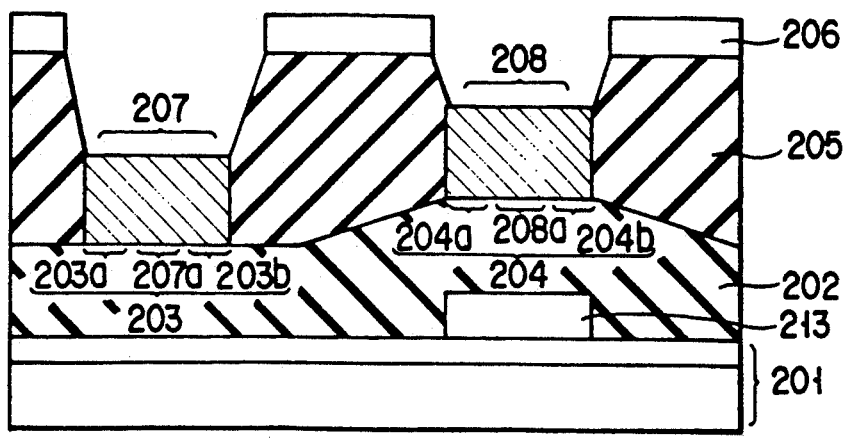
F I G. 5C
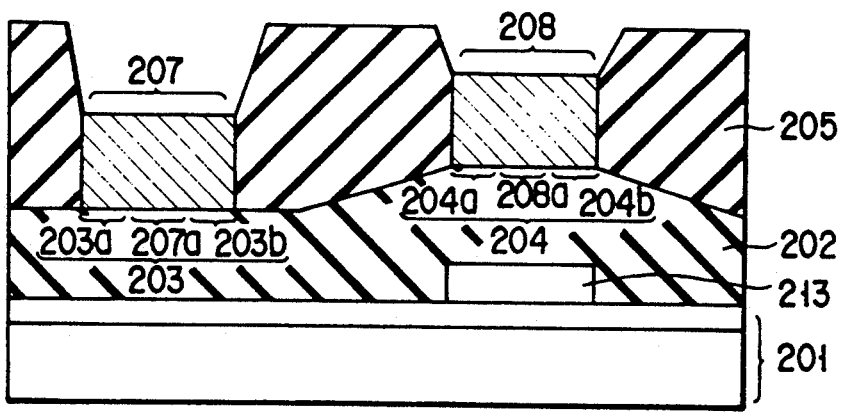
F I G. 5D

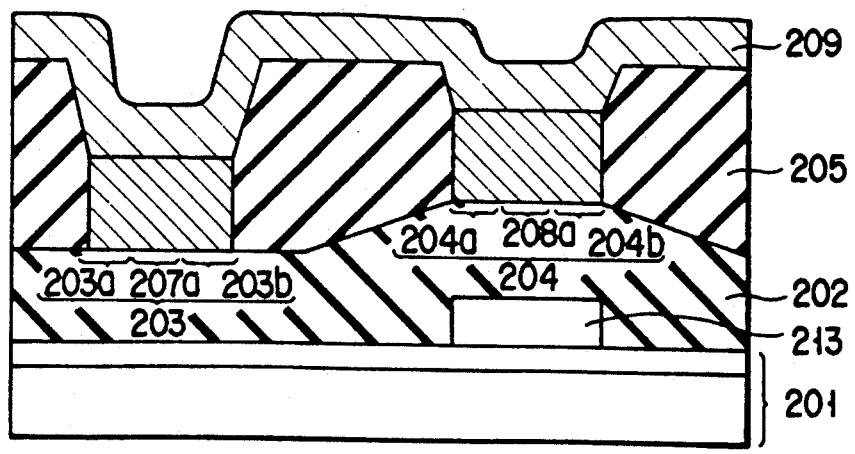
F I G. 5E
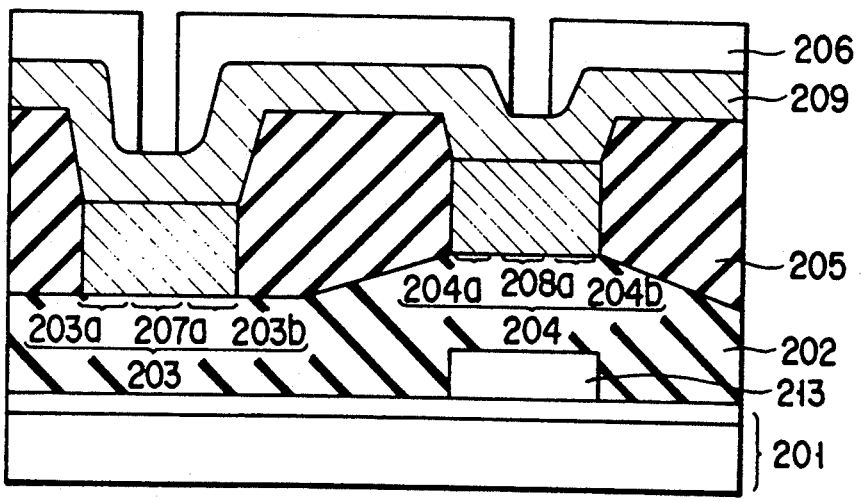
F I G. 5F

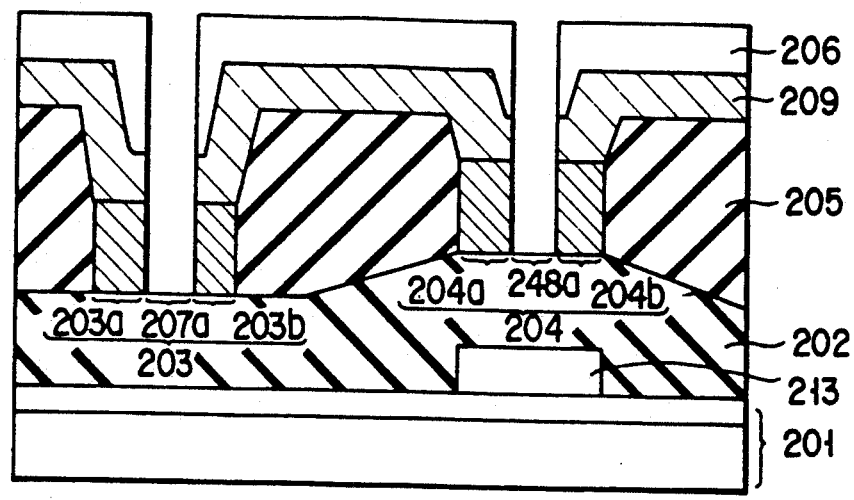
F I G. 5G
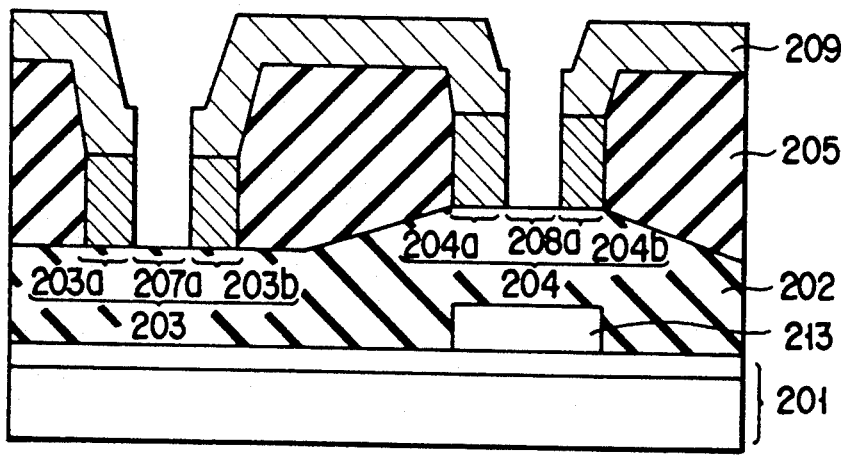
F I G. 5H

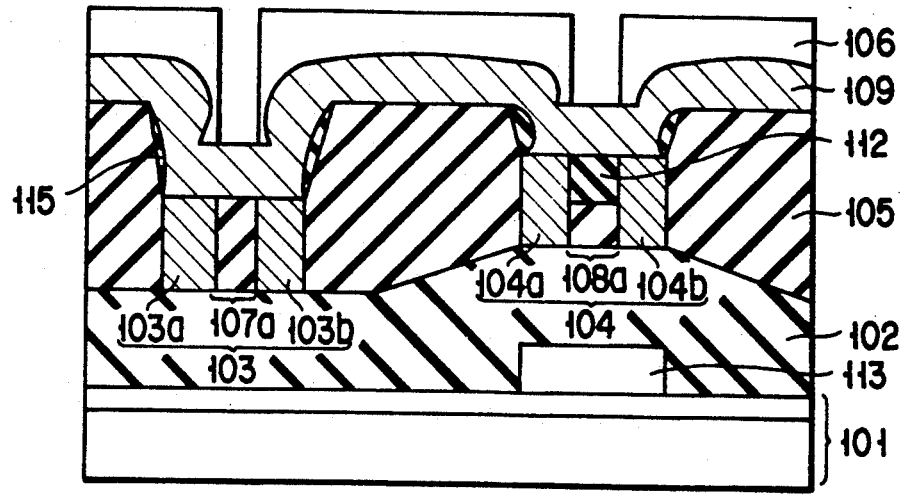
F I G. 6G
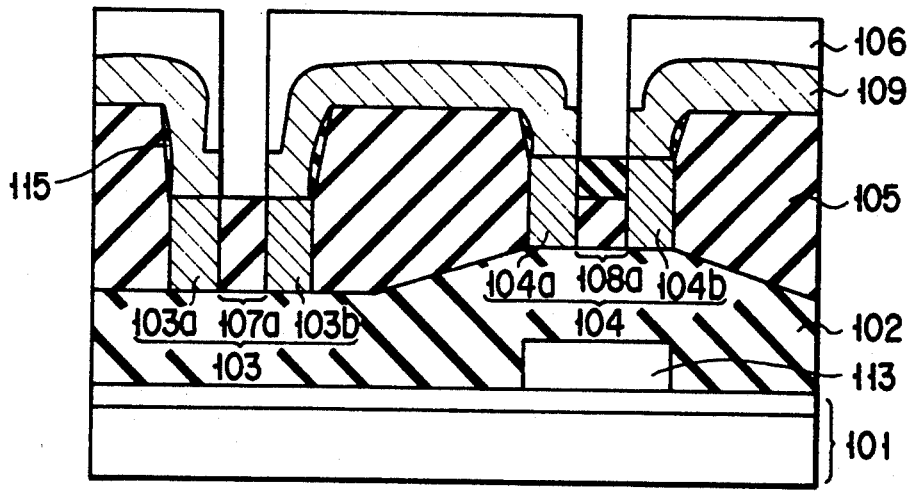
F I G. 6H

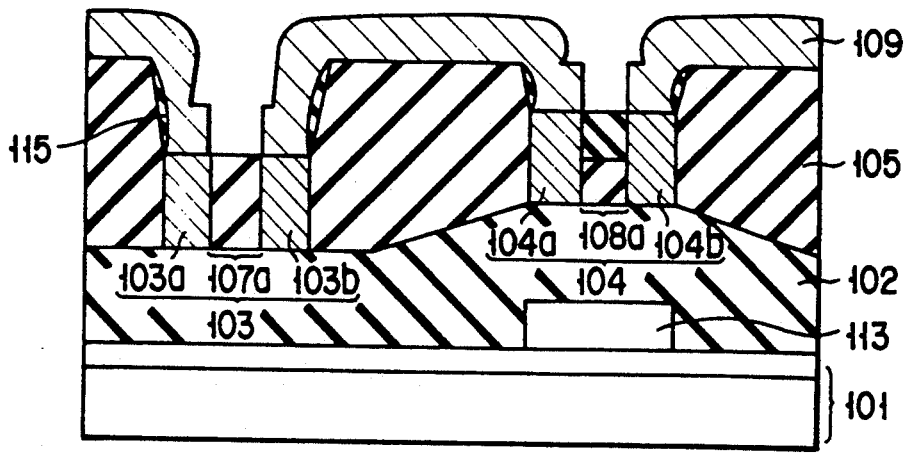
F I G. 6I

METHOD OF FORMING MULTILAYERED WIRING STRUCTURE OF SEMICONDUCTOR DEVICE

BACKGROUND OF THE INVENTION

1. Field of the Invention

The present invention relates to a method of forming a multilayered wiring structure of a semiconductor device.

2. Description of the Related Art

A multilayered wiring structure in a large scale integrated semiconductor circuit (LSI) is frequently used to give a wide margin of coupling elements arranged in a semiconductor substrate and form a high-density, high-speed device.

FIGS. 1A to 1H are sectional views for explaining the steps in forming a multilayered wiring structure of a conventional semiconductor device. As shown in FIG. 1A, in formation of a conventional multilayered wiring structure, an insulating layer 2 is formed on the surface of a semiconductor substrate 2 and is selectively removed so as to allow connections with the substrate 1. An aluminum film is deposited on the entire surface of the resultant structure and is patterned to form at least two lower wiring layers 3a and 3b adjacent to each other. Each lower wiring layer is formed in advance to have a dimension corresponding to a diameter of a via hole. In order to form upper wiring layers, an insulating interlayer 4 is formed on the insulating film 2 and the first and second lower wiring layers 3a and 3b, and the insulating interlayer 4 is planarized by a known resist etch-back method. As shown in FIG. 1B, a resist 5 is formed on the insulating interlayer 4 and is patterned into a predetermined pattern in accordance with a known photolithographic technique. The resist 5 must be patterned to have openings corresponding to the sizes of the via holes. As shown in FIG. 1C, openings 6a and 6b for contact holes are formed in parts of the insulating interlayer 4 on the first and second lower wiring layers 3a and 3b using the resist 5 having the predetermined pattern as a mask in accordance with a known reactive ion etching technique (to be referred to as RIE hereinafter). The openings 6a and b must be formed to correspond to the lower wiring layers 3a and 3b, respectively. As shown in FIG. 1D, the resist 5 is removed. As shown in FIG. 1E, an aluminum film 7 for the upper wiring layers is formed on the insulating interlayer 4 including the lower wiring layers 3a and 3b in the openings. As shown in FIG. 1F, a resist 5 is formed on the aluminum layer 7 and is patterned to have a predetermined pattern in accordance with the known photolithographic technique. As shown in FIG. 1G, the aluminum film 7 on the insulating interlayer 4 between the lower wiring layers 3a and 3b is partially removed using the resist 5 having the predetermined pattern in accordance with RIE, thereby forming upper wiring layers 7a and 7b which are separated from each other and electrically connected to the lower wiring layers 3a and 3b. It is noted that the aluminum film 7 is cut on the narrow portion of the insulating interlayer 4 between the lower wiring layers 3a and 3b. As shown in FIG. 1H, the resist 5 is removed by a known resist removal method. Similarly, insulating interlayers and wiring layers are alternately formed in accordance with the required number of layers, thereby realizing a multilayered wiring structure.

According to this formation method, however, the resist 5 formed on the insulating interlayer 4 between the lower wiring layers 3a and 3b has a very narrow pattern, as shown in FIG. 1C. For example, assume that the distance between the two lower wiring layers is 1.2 $\mu$m, and that openings each having a taper angle of 75° with respect to a 1-$\mu$m thick insulating interlayer are formed. In consideration of a dimensional conversion error of 0.1 $\mu$m, the resist 5 formed on the insulating interlayer 4 between the lower wiring layers 3a and 3b has a very narrow pattern with a width of 0.57 $\mu$m or less. For this reason, when the openings are to be formed, if the resist floats or is peeled, openings 6a and 6b having stable shapes cannot be obtained. For this reason, upper wiring layers 7a and 7b cannot be stably patterned. As a result, short-circuiting occurs between the upper wiring layers, and disconnections occur in the upper wiring layers. In resist patterning, if a mask alignment error occurs, a groove 8 is undesirably formed in the side wall of the lower wiring layer by overetching in formation of the openings, as shown in FIG. 1C. In deposition of the aluminum film for the upper wiring layers, since the width of the groove 8 is very narrow, the groove 8 cannot be covered with the Al film. As a result, as shown in FIG. 1H, a void 9 is formed to decrease the product yield and degrade reliability.

FIGS. 2A to 2H are sectional views for explaining the steps of forming a multilayered wiring stricture of another conventional semiconductor device. In this example, one lower wiring portion 303 and the other wiring portion 304 have different levels. As shown in FIG. 2A, a first insulating film 302 is formed on the surface of a semiconductor substrate 301 having a polycrystalline semiconductor layer 313 or the like. After necessary portions of the first insulating film 302 which are required for connections with the substrate 301 are removed, an aluminum film is deposited on the entire surface of the resultant structure and is patterned, thereby forming the first wiring portion 303 having at least two lower wiring layers 303a and 303b adjacent and electrically connected to each other on the lower portion of the first insulating film 302, and also forming the second wiring portion 304 having at least two lower wiring layers 304a and 304b adjacent and electrically connected to each other on the upper portion of the first insulating film 302. To form upper wiring layers, an insulating interlayer 305 is formed on the first insulating film 302 and the lower wiring layers 303a, 303b, 304a, and 304b of the wiring portions 303 and 304 and is planarized in accordance with the known etch-back method. As shown in FIG. 2B, a resist 306 is formed on the insulating interlayer 305 and is patterned into a predetermined pattern in accordance with the known photolithographic technique. As shown in FIG. 2C, openings 307a, 307b, 308a, and 308b for contact holes are formed in parts of the insulating interlayer 305 on the lower wiring layers 303a, 303b, 304a, and 304b using the resist 306 having the predetermined pattern as a mask in accordance with known tapered reactive ion etching (to be referred to as tapered RIE hereinafter). The openings are formed to correspond to the lower wiring layers 303a, 303b, 304a, and 304b, respectively. As shown in FIG. 2D, the resist 306 is removed by the known resist removal method. As shown in FIG. 2E, an aluminum film 309 for upper wiring layers is formed on the insulating interlayer 305 so as to include the lower wiring layers 303a, 303b, 304a, and 304b in the openings. As shown in FIG. 2F, a resist 306 is formed on the aluminum film 309 and is patterned into a predetermined pattern in accordance with the known photolithographic technique. As shown in FIG. 2G, the aluminum film 309 is partially removed from the insulating interlayer 305 present between the lower wiring layers 303a and 303b and between the lower wiring layers 304a and 304b using the resist 306 having the predetermined pattern as a mask, thereby obtaining independent upper wiring layers connected to the lower wiring layers 303a, 303b, 304a, and 304b. Thereafter, as shown in FIG. 2H, the resist 306 is removed by the known resist removal method. Insulating interlayers and wiring layers are alternately formed, as needed, to obtain a multilayered wiring structure.

However, again, according to this formation method, since the distance between the lower wiring layers is reduced, the resist 306 formed on the insulating interlayer 305 between the lower wiring layers 303a and 303b and between the lower wiring layers 304a and 304b inevitably has a very narrow pattern, as shown in FIG. 2C. In formation of the openings, the resist undesirably floats or is peeled. As a result, the openings 307a, 307b, 308a, and 308b cannot have a stable shape. In addition, when a mask alignment error occurs in patterning the resist, a groove 310 is formed on the side wall of the lower wiring layer by overetching in formation of the openings, as shown in FIG. 2C. For this reason, even if the aluminum film 309 serving as prospective upper wiring layers is deposited, the aluminum film 309 cannot perfectly cover the underlying structure because the groove width is very small. As a result, as shown in FIG. 2E, a cavity 311 is formed to reduce the product yield and degrade reliability.

FIGS. 3A to 3G are sectional views for explaining the steps in forming a multilayered wiring structure of still another conventional semiconductor device. In this conventional example, one lower wiring layer and the other lower wiring layer have a step. As will be described in detail below, large openings 407 and 408 are formed. This formation method is proposed by the present inventor. According to this method, a thin resist pattern need not be formed, openings each having a predetermined shape can be obtained, and formation of a groove by overetching in mask misalignment and formation of a cavity during forming the upper wiring layers can be eliminated.

As shown in FIG. 3A, a polycrystalline semiconductor layer 413, a first insulating film 402, lower wiring layers 403a and 403b constituting a first wiring portion 403, lower wiring layers 404a and 404b constituting a second wiring portion 404, and an insulating interlayer 405 are formed on a semiconductor substrate 401. As shown in FIG. 3B, after a resist 406 is formed on the insulating interlayer 405, the resist 406 is formed into a predetermined pattern in accordance with the known photolithographic technique. Openings 406a and 406b of the resist 406 are formed to have sizes including the first and second wiring portions 403 and 404, respectively. As shown in FIG. 3C, the insulating interlayer 405 exposed from the openings 406a and 406b of the resist 406 is uniformly etched to reach the first wiring portion 403 located at the lower portion in accordance with known tapered reactive ion etching (to be referred to as tapered RIE hereinafter) using the resist 406 having the predetermined pattern as a mask, thereby forming openings 407 and 408 for contact holes. At this time, a surface formed by the lower wiring layers 403a and 403b exposed in the opening 407 corresponding to the first wiring portion 403, and by an insulating interlayer portion 407a between the lower wiring layers 403a and 403b is almost flat. A surface formed by the lower wiring layers 404a and 404b exposed in the opening 408 corresponding to the second wiring portion 404, and by an insulating interlayer portion 408a between the lower wiring layers 404a and 404b has a structure with a stepped portion 410 because the etching depth is uniform. The stepped portion 410 in the second wiring portion 404 is caused by a polycrystalline semiconductor layer 413 located below the first insulating film 402 under the second wiring portion 404. For example, assume that this polycrystalline semiconductor layer 413 has a thickness of 0.4 μm, and that the insulating interlayer at the insulating interlayer portion 407a between the lower wiring layers of the first wiring portion 403 has a thickness of 1.0 μm. At this time, the insulating interlayer at the insulating interlayer portion 408a between the lower wiring layers of the second wiring portion 404 is 0.6 μm. After the resist 406 is removed by the known resist removal method, as shown in FIG. 3D, an aluminum film 409 for upper wiring layers is formed on the first and second wiring portions 403 and 404 in the openings 407 and 408. At this time, since the stepped portion 410 forms a groove, the aluminum film 409 is deposited in a large amount and the thickness of the aluminum film is increased in this portion. As shown in FIG. 3E, a resist 406 having a predetermined pattern is formed such that openings are located above the insulating interlayer portion 407a between the lower wiring layers 403a and 403b of the first wiring portion 403 and above the insulating interlayer portion 408a between the lower wiring layers 404a and 404b of the second wiring portion 404 in accordance with the known photolithographic technique. As shown in FIG. 3F, the aluminum film 409 is partially removed on the insulating interlayer portions 407a and 408a of the first and second wiring portions 403 and 404 in accordance with RIE using the resist 406 having a predetermined pattern as a mask, thereby forming independent upper wiring layers connected to the corresponding lower wiring layers. Thereafter, as shown in FIG. 3G, the resist 406 is removed by the known resist removal method.

According to this formation method, however, as shown in FIG. 3C, when the aluminum film 409 for the upper wiring layers is deposited, the thickness of the aluminum film 409 at the stepped portion 410 is increased due to the presence of the stepped portion 410 in the second wiring portion. When the aluminum film 409 between the connecting portions is removed for insulation, an aluminum film residual portion 411 is formed between the lower wiring layers 404a and 404b, as shown in FIG. 3F. For this reason, electric insulation cannot be achieved, and failures such as short-circuiting occur. As a result, the product yield is reduced, and reliability is degraded.

SUMMARY OF THE INVENTION

It is an object of the present invention to provide a method of forming a highly reliable multilayered wiring structure, wherein the conventional problems described above can be solved, a high product yield can be obtained, short-circuiting between via holes and poor coverage can be prevented, and micropatterning of an integrated circuit can be coped with.

According to an aspect of the present invention, there is provided a method of forming a multilayered wiring structure, comprising the steps of: forming a first conductive film for a predetermined number of lower wiring layers on a predetermined region of a semiconductor substrate; forming an insulating interlayer on the semiconductor substrate including the first conductive film; partially removing the insulating interlayer to expose the first conductive film, thereby forming an opening; forming a second conductive film for upper wiring layers on the first conductive film exposed in the opening and an upper surface of the insulating interlayer, the second conductive film being in contact with the first conductive film; and simultaneously and selectively removing the first and second conductive films to form the upper and lower wiring layers isolated in a predetermined number within the opening.

According to another aspect of the present invention, there is provided a method of forming a multilayered wiring structure of a semiconductor device, comprising the steps of: forming a plurality of first conductive films each for a predetermined number of lower wiring layers in a predetermined region of a first stepped insulating film formed on a semiconductor substrate; forming an insulating interlayer on the semiconductor substrate including the plurality of first conductive films; partially removing the insulating interlayer until one of the plurality of first conductive films which is located at a lowest position is exposed, thereby forming a plurality of openings; forming a second conductive film for upper wiring layers on the insulating interlayer including the plurality of first conductive films, the second conductive film being in contact with the first conductive films; and simultaneously and selectively removing the first and second conductive films to form the upper and lower wiring layers each in a predetermined number within each opening.

According to still another aspect of the present invention, there is provided a method of forming a multilayered wiring structure of a semiconductor device, comprising the steps of: forming first and second wiring portions each having a predetermined number of lower wiring layers electrically insulated from each other and adjacent to each other, the first and second wiring portions being formed on a first stepped insulating film formed on a semiconductor substrate; forming an insulating interlayer on the semiconductor substrate including the first and second wiring portions; planarizing an upper surface of the insulating interlayer; partially removing the insulating interlayer until the first and second wiring portions are exposed, thereby forming first and second openings; forming a second insulating film on exposed surfaces of the first and second wiring portions; removing the second insulating film while leaving the second insulating film between lower wiring layers of the second wiring portion such that the second insulating film has the same level as that of the lower wiring layers; forming the first and second openings for exposing the first and second wiring portions again; forming a conductive film for upper wiring layers on an upper surface of the insulating interlayer including the first and second wiring portions such that the conductive film is in contact with the first and second wiring portions; and selectively removing the conductive film located between the lower wiring layers to form isolated upper and lower wiring layers each in a predetermined number within the first and second openings.

In the method of forming the multilayered wiring structure of the present invention, the conductive film is formed on the first and second prospective lower wiring layer formation regions and the prospective isolation region between the first and second wiring layers, and the openings which can cover the conductive film are formed. The upper wiring layer is deposited on the insulating interlayer including the openings. The conductive film on the prospective isolation region between the lower wiring layers and the upper wiring portion located on the conductive film are simultaneously and selectively removed, thereby independently isolating the upper wiring layer and the conductive film. Unlike in the conventional method, no narrow resist pattern portion is used, and openings each having a predetermined shape can be obtained. Therefore, the upper wiring layers can be properly isolated from each other, the yield of the wiring layers can be increased, and reliability can be improved. In addition, the upper and lower wiring layers can be self-aligned using the same mask. For this reason, the upper wiring pattern is properly matched with the lower wiring pattern. The lower wiring layers will not be abnormally etched by overetching during formation of the upper wiring layers. As a result, no cavity will be formed during formation of the upper wiring layers. The product yield can be increased, and reliability can be improved. Furthermore, the opening area of the opening can be large, and the aspect ratio in the opening is reduced. Coverage of the upper wiring layers can be improved, the resistance in the opening can be stabilized, and the yield can be increased. Resistance to electromigration can be increased in the opening, and reliability can be further improved. As a result, according to the present invention, a highly reliable multilayered wiring structure can be obtained at a high yield.

In the method of manufacturing the multilayered wiring structure according to the present invention, when an underlying semiconductor layer such as a polycrystalline semiconductor layer is present or a stepped portion is formed by a multilayered arrangement, unlike in the conventional method, a thin resist pattern portion need not be formed, and an ideal opening shape can be obtained, thereby further assuring isolation of the upper wiring layers. First, the stepped portion formed by etching the third insulating film is perfectly buried with the third insulating film. For this reason, an aluminum residual portion which is formed in the stepped portion upon formation of the upper wiring layer in the conventional technique can be eliminated. Short-circuiting between the lower wiring layers can be prevented, and the product yield can be increased. Since a side wall is formed in the opening by the third insulating film, coverage of the upper wiring layers can be improved. In addition, a groove between the lower wiring layers can be eliminated, and coverage of the insulating film formed on the upper wiring layers can also be improved. Second, since the common lower wiring layers adjacent to the openings are formed, even if mask misalignment occurs in forming the openings, excessive overetching is not caused, neither and a groove nor a cavity is formed. In addition, since the opening area is large, coverage of the aluminum film is improved, and the thickness of the aluminum film on the side wall of the opening can be increased. For this reason, the sectional area of the wiring pattern is increased, the current density will not be increased, and resistance to electromigration can be increased. Therefore, according to the present invention, a highly reliable multilayered wiring structure can be obtained at a high yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4H are sectional views for explaining the steps in forming a multilayered wiring structure of a semiconductor device according to the first embodiment of the present invention;

FIGS. 5A to 5H are sectional views for explaining the steps in forming a multilayered wiring structure of a semiconductor device according to the second embodiment of the present invention; and FIGS. 6A to 6I are sectional views for explaining the steps in forming a multilayered wiring structure of a semiconductor device according to the third embodiment of the present invention.

DETAILED DESCRIPTION OF THE PREFERRED EMBODIMENTS

A method of forming a multilayered wiring structure of a semiconductor device will be described in detail with reference to the accompanying drawings.

Figure 1A:
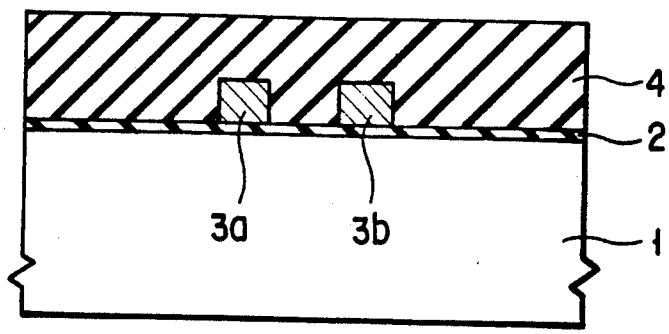
FIGS. 1A to 1H are sectional views for explaining the steps in forming a multilayered wiring structure of a conventional semiconductor device.
Figure 1B:
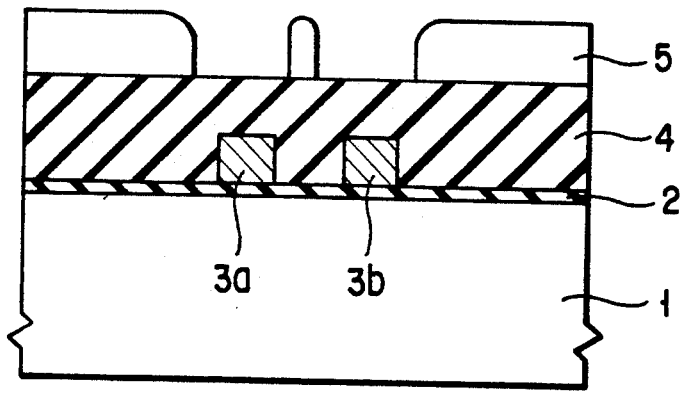
Figure 1C:
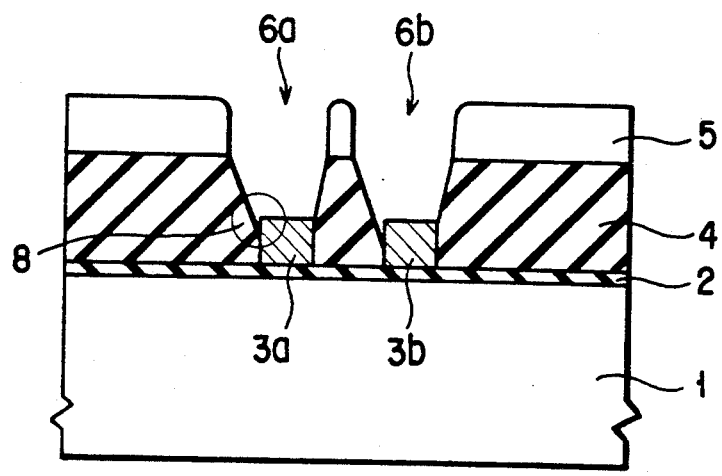
Figure 1D:
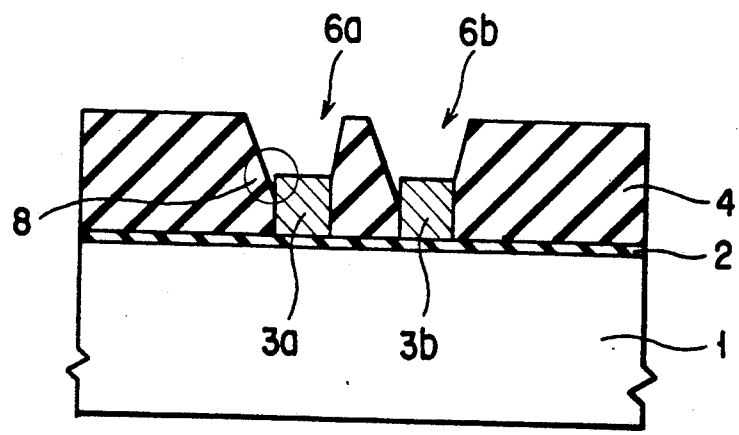
Figure 1E:
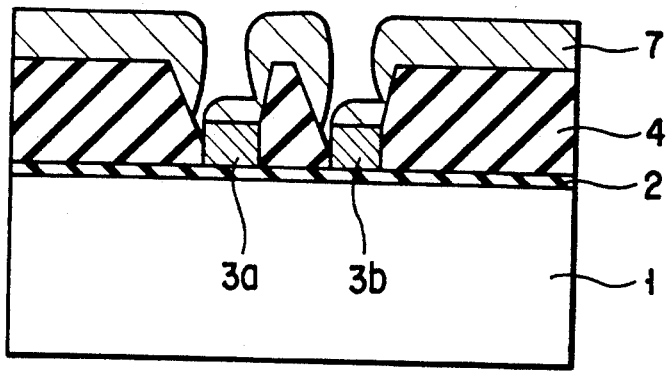
Figure 1F:
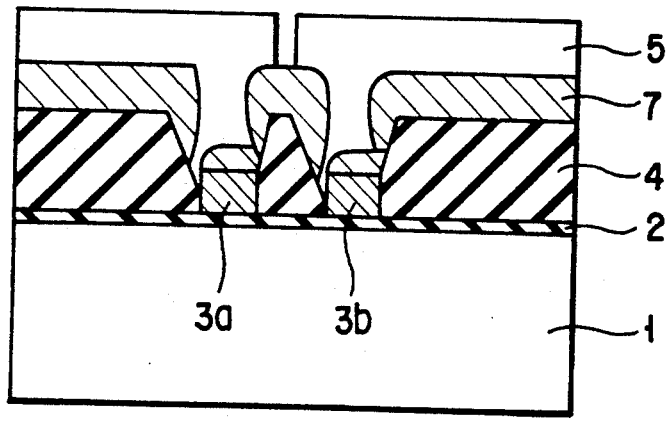
Figure 1G:
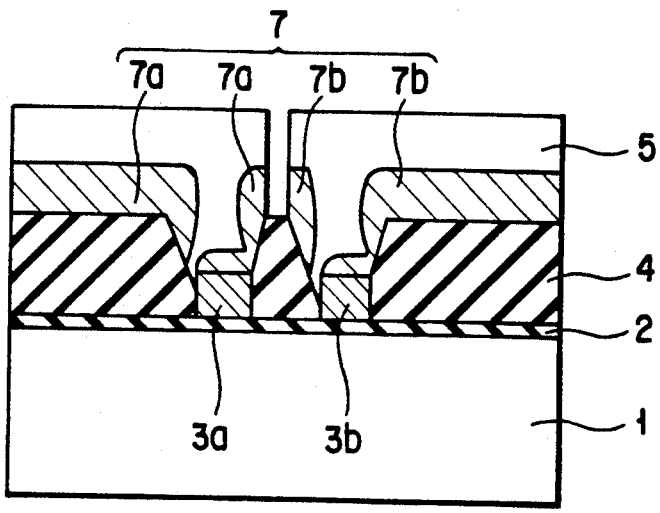
Figure 1H:
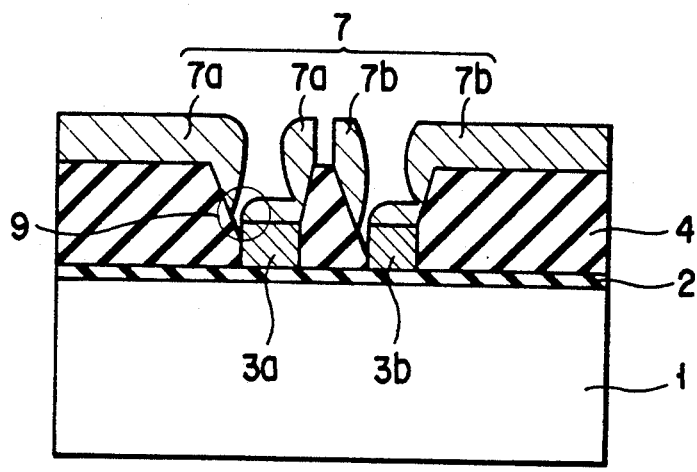
Figure 2A:
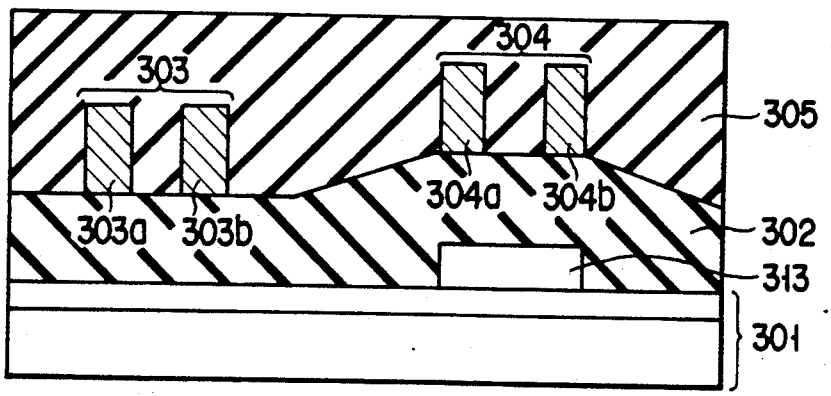
FIGS. 2A to 2H are sectional views for explaining the steps in forming a multilayered wiring structure of another conventional semiconductor device.
Figure 2B:
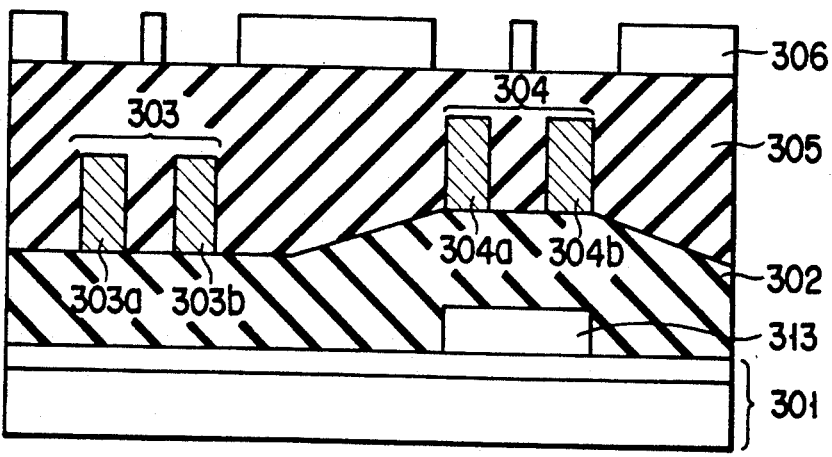
Figure 2C:
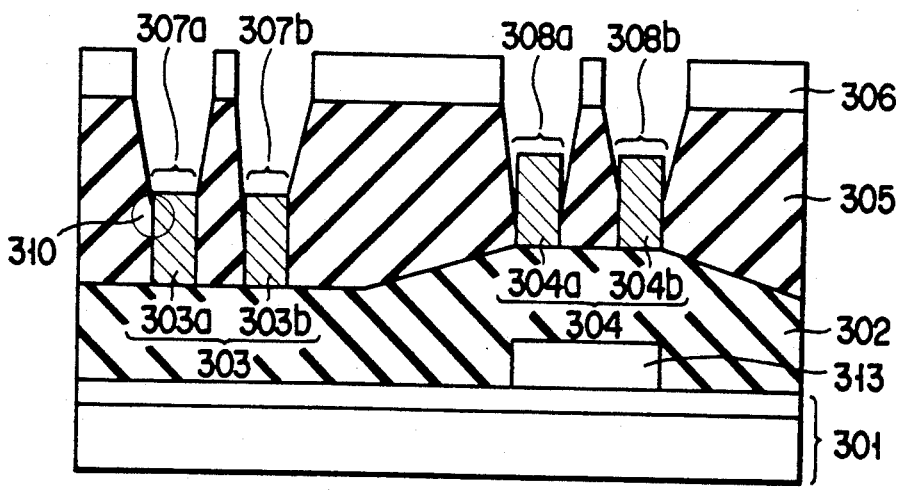
Figure 2D:
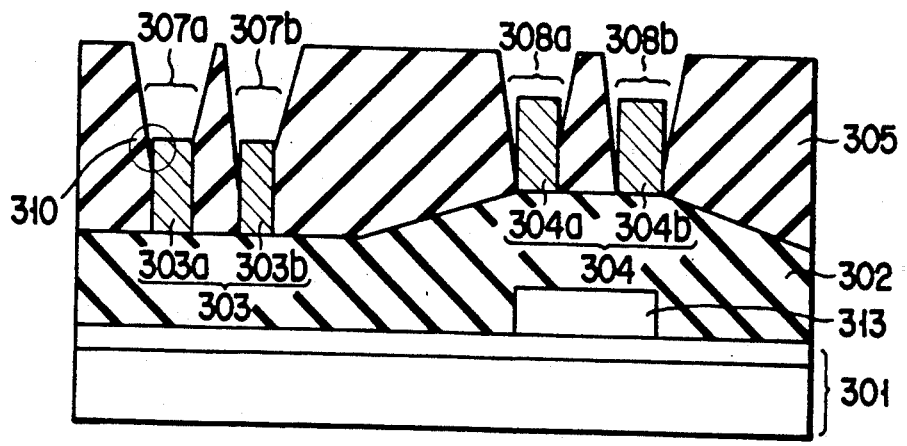
Figure 2E:
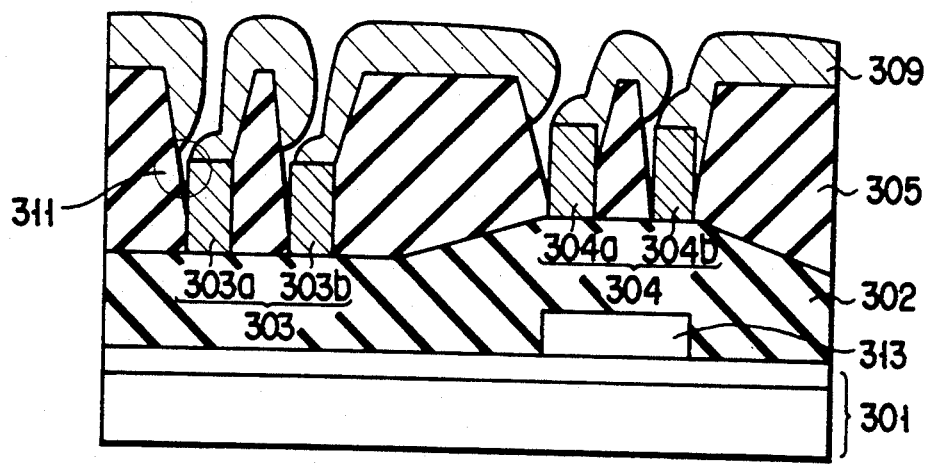
Figure 2F:
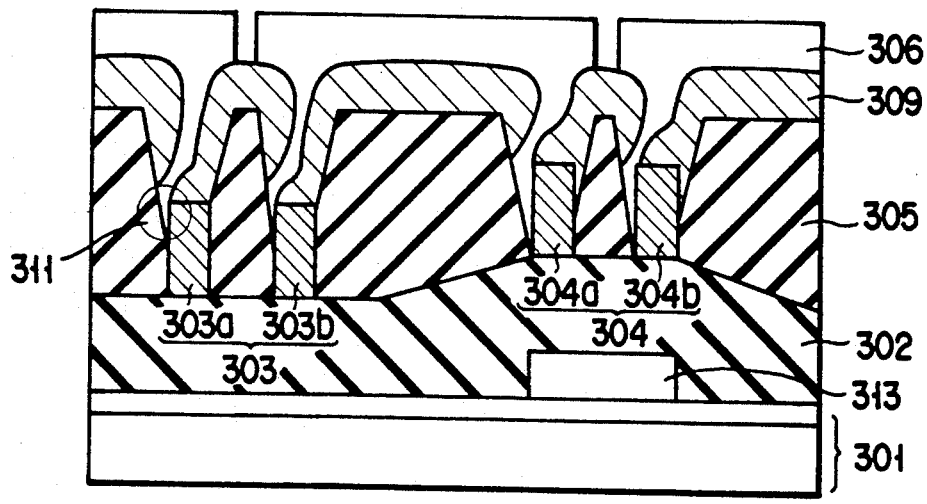
Figure 2G:
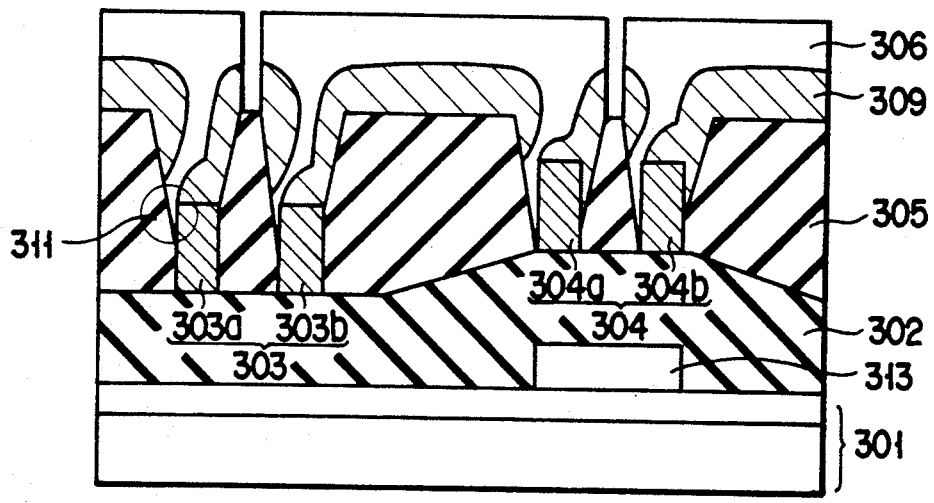
Figure 2H:
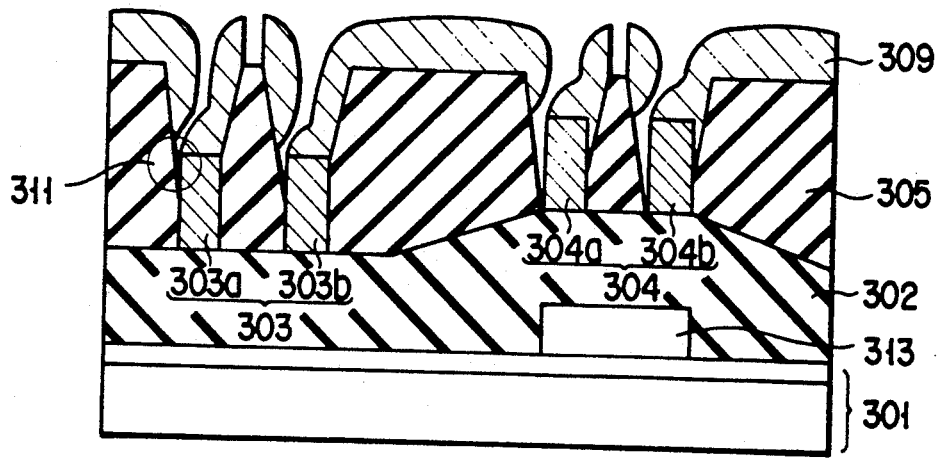
Figure 3A:
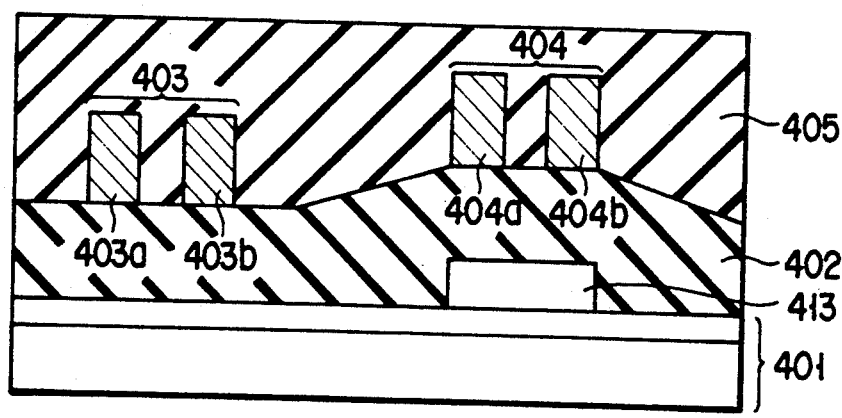
FIGS. 3A to 3G are sectional views for explaining the steps in forming a multilayered wiring structure of still another conventional semiconductor device.
Figure 3B:
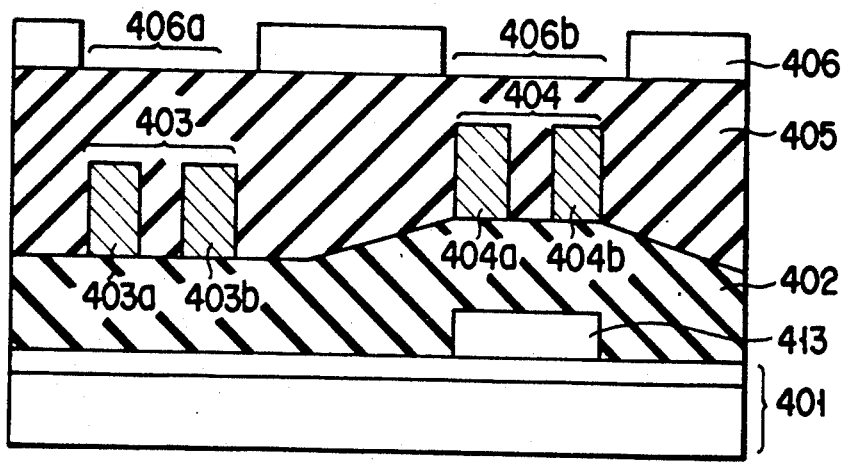
Figure 3C:
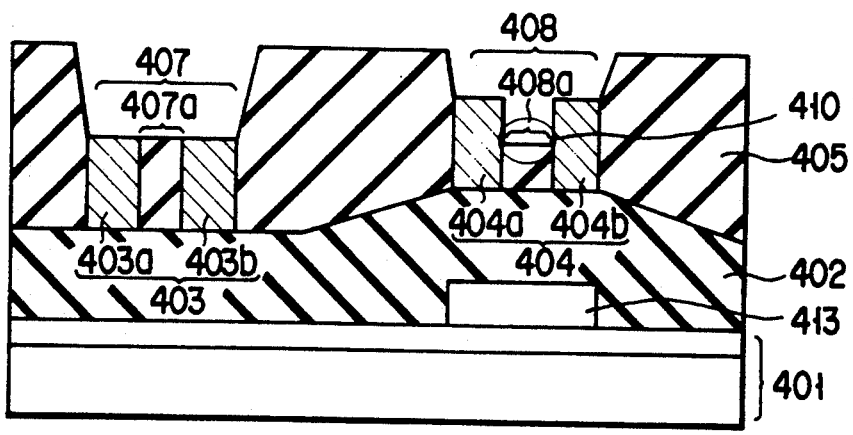
Figure 3D:
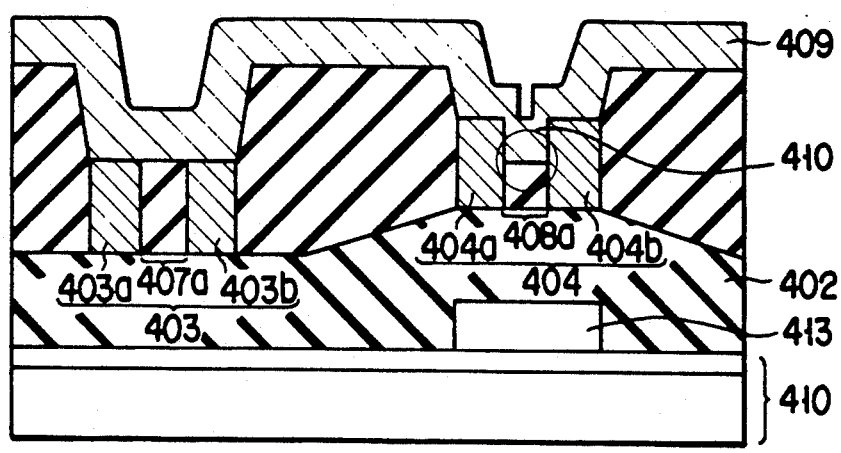
Figure 3E:
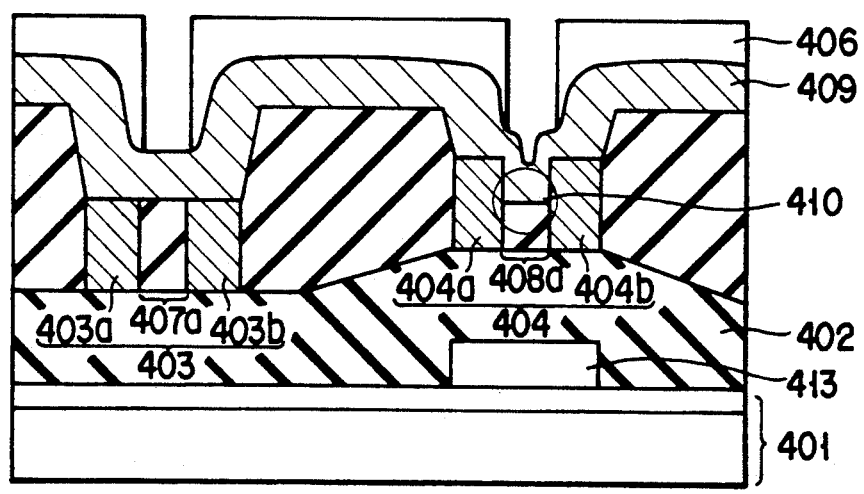
Figure 3F:
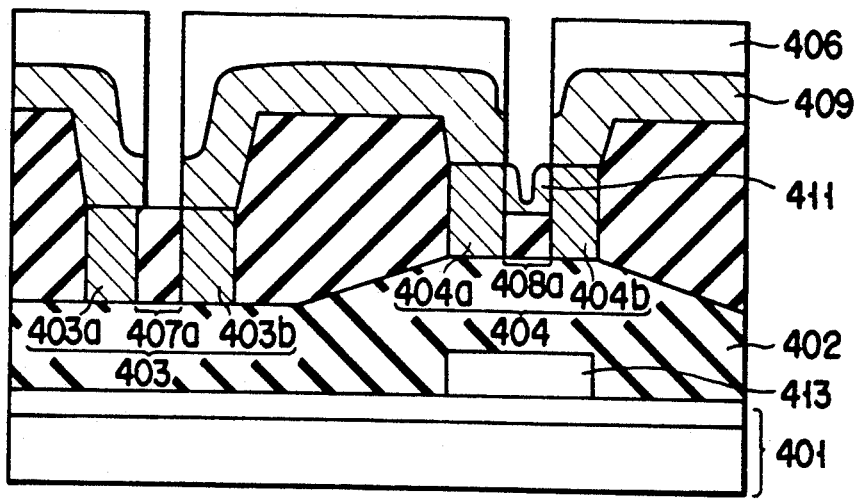
Figure 3G:
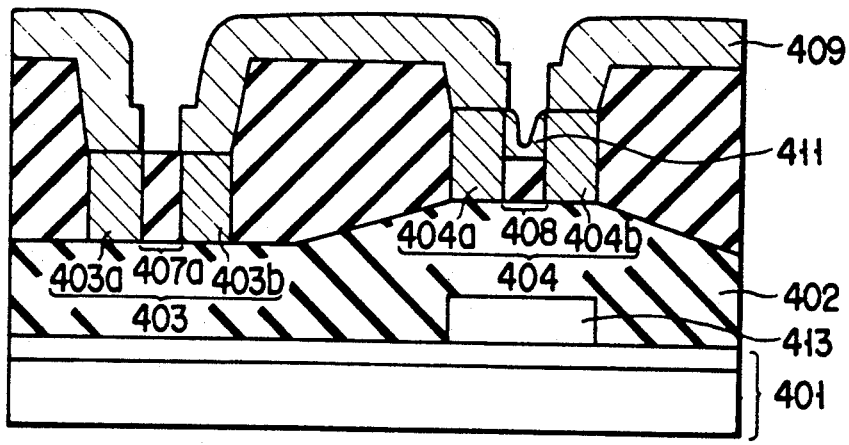
Figure 4D:
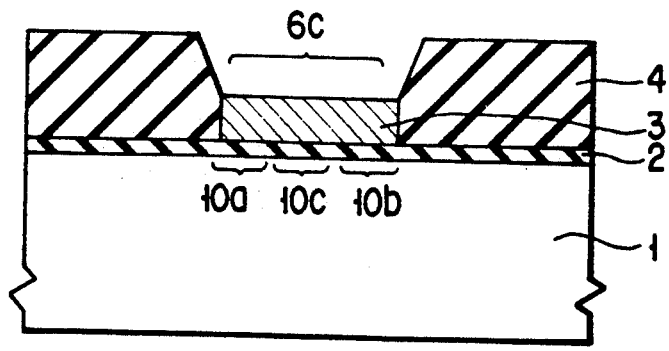
Figure 4E:
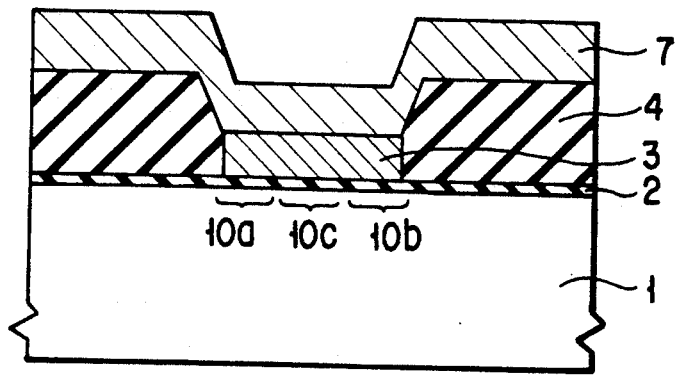
Figure 4F:
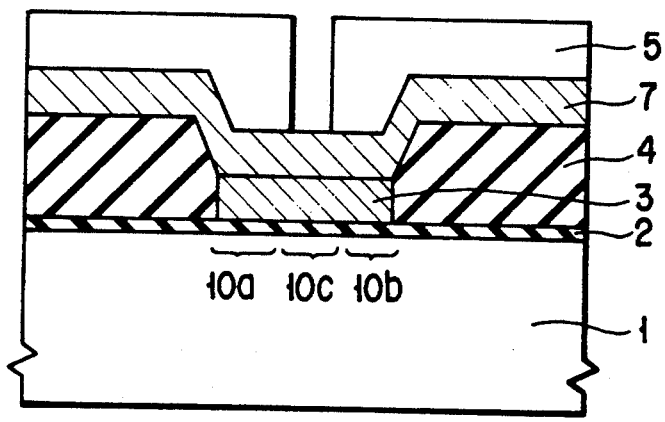
Figure 4G:
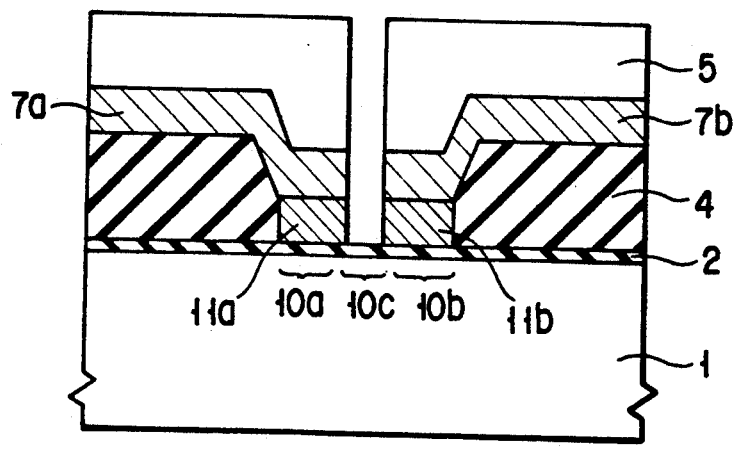
Figure 4H:
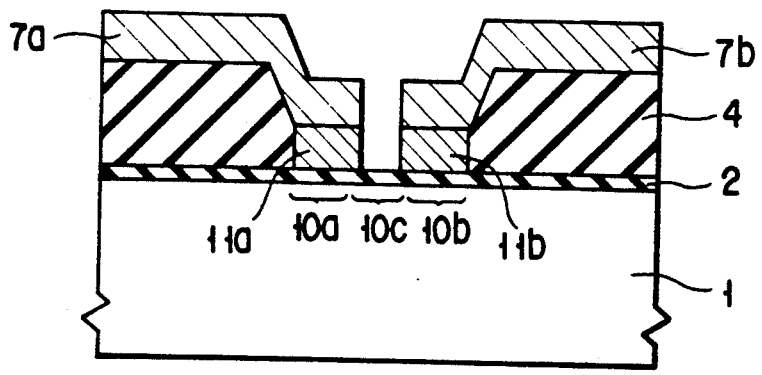

FIGS. 4A to 4H are sectional views for explaining the steps in forming a multilayered wiring structure of a semiconductor device according to the first embodiment of the present invention. As shown in FIG. 4A, an insulating film 2 is formed on the upper surface of a semiconductor substrate 1, and part of the insulating film 2 which is required for connection with the substrate is removed. An aluminum film is deposited on the entire surface of the resultant structure and is patterned to form a conductive film 3 having a size corresponding to the necessary number of lower wiring layers and isolation regions therebetween. For the sake of descriptive simplicity, as shown in FIG. 4A, the conductive film 3 is formed on first and second prospective lower wiring layer formation regions 10a and 10b and a prospective isolation region 10c between the lower wiring layers. In order to form an upper wiring layer, an insulating interlayer 4 is formed on the insulating film 2 and the conductive film 3. The insulating interlayer 4 is planarized in accordance with a known resist etch-back method. As shown in FIG. 4B, a resist 5 is formed on the insulating interlayer 4 and is patterned into a predetermined pattern in accordance with a known photolithographic technique. An opening 5a of this resist is formed to cover the conductive film 3. As shown in FIG. 4C, the insulating interlayer 4 exposed in the opening 5a of the resist is uniformly removed so as to reach the conductive film 3 to form an opening 6c for a contact hole in accordance with known tapered reactive ion etching (to be referred to as tapered RIE hereinafter) using the resist 5 having a predetermined pattern as a mask. According to the present invention, the required number of lower wiring layers is included in one opening 6c, as compared with the conventional case. As shown in FIG. 4D, the resist 5 is removed by the known resist removal method. As shown in FIG. 4E, an aluminum film 7 for upper wiring layers is formed on the insulating interlayer 4 including the conductive film 3 in the opening 6c. As shown in FIG. 4F, a resist 5 having a predetermined pattern with an opening is formed on the conductive film and the aluminum film 7 on the prospective isolation region 10c between the first and second lower wiring layers in accordance with the photolithographic technique. As shown in FIG. 4G, the aluminum film 7 present on the prospective isolation region 10c between the first and second lower wiring layers is partially removed in accordance with RIE using the resist 5 having the predetermined pattern as a mask to obtain independent upper wiring layers 7a and 7b. At the same time, the conductive film 3 present on the prospective isolation region 10c between the first and second lower wiring layers is partially removed so as to reach the insulating film 2 using the resist 5 having the predetermined pattern as a mask, thereby forming lower wiring layers 11a and 11b. In the conventional technique, after the lower wiring layers are formed in advance, the subsequent necessary steps are performed to form upper wiring layers. According to the present invention, however, the upper and lower wiring layers are disconnected from each other using the same mask even within the same step. The independent isolated conductive film portions, i.e., the independent lower wiring layers 11a and 11b and the independent upper wiring layers 7a and 7b are electrically connected to each other. As shown in FIG. 4H, the resist 5 is removed in accordance with the known resist removal method. In FIGS. 4A to 4H, for the sake of descriptive simplicity, the number of upper or lower wiring layers is two. However, N lower wiring layers and N upper wiring layers can be formed in one via hole. Thereafter, insulating interlayers and conductive films are alternately formed to obtain a multilayered wiring structure in accordance with the number of necessary layers.

According to the method of forming the multilayered wiring structure according to the first embodiment, a thin resist pattern portion used in the conventional technique need not be formed, and an ideal opening shape is obtained. In addition, isolation of the independent upper wiring layers can be achieved. The lower and upper wiring layers in the opening can be formed in self-alignment with each other using the same mask. For this reason, the upper wiring pattern is properly matched with the lower wiring pattern. The lower wiring layers will not be abnormally etched by overetching during formation of the upper wiring layers. As a result, neither a cavity nor a groove will be formed during formation of the upper wiring layers. Furthermore, since the opening area can be large, coverage of the upper wiring layers can be improved, and the thickness of the aluminum film on the side surface of the opening is increased. For this reason, the sectional area of the wiring layer is increased, the current density will not be increased, and resistance to electromigration can be increased. As a result, a highly reliable multilayered wiring structure can be formed at a high yield.

Figure 5A:
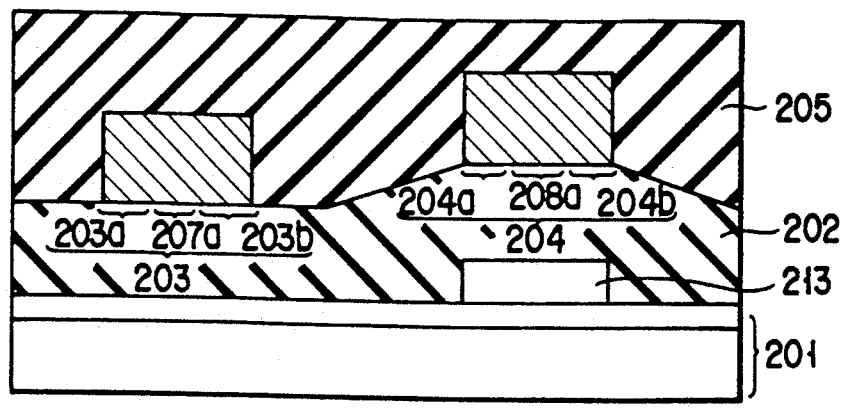
Figure 5B:
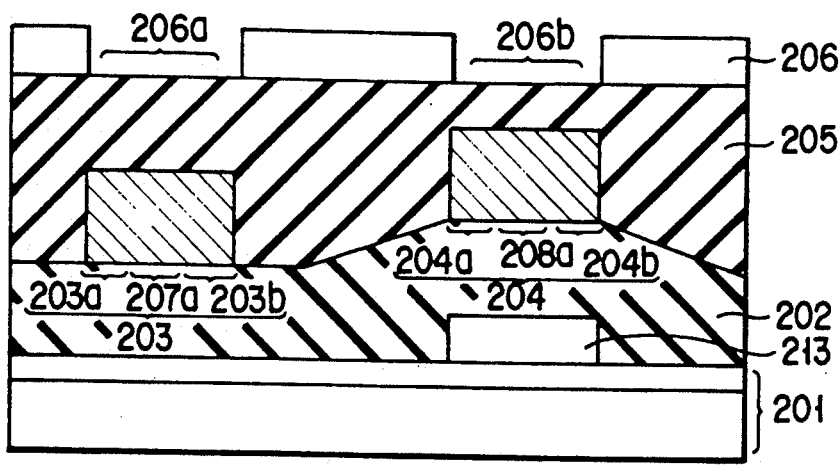

FIGS. 5A to 5H are sectional views for explaining the steps in forming a multilayered wiring structure of a semiconductor device according to the second embodiment of the present invention. A first insulating film 202 is formed on the upper surface of a semiconductor substrate 201 having a multilayered wiring structure and a polycrystalline semiconductor layer 213. The first insulating film 202 has a stepped portion due to the presence of the polycrystalline semiconductor layer 213. After part of the first insulating film 202 which is required for connection with the substrate 201 is removed, an aluminum film is deposited on the entire surface of the resultant structure and is patterned. As shown in FIG. 5A, two prospective lower wiring layer formation regions 203a and 203b are formed on the lower portion of the stepped portion of the first insulating film 202, and a first conductive film 203 for lower wiring layers is formed on a prospective isolation region 207a between the lower wiring layers. Two prospective lower wiring regions 204a and 204b are formed on the higher portion of the stepped portion, and a second conductive film 204 for lower wiring layers is formed on a prospective isolation region 208a between the lower wiring layers. An insulating interlayer 205 is formed on the first insulating film 202 and the conductive films 203 and 204 so as to form upper wiring layers. The insulating interlayer 205 is planarized by the known resist etch-back method. As shown in FIG. 5B, a resist 206 is formed on the insulating interlayer 205 and is formed into a predetermined pattern in accordance with the photolithographic technique. Openings 206a and 206b of the resist 206 are formed to have sizes which cover the first and second conductive films 203 and 204. As shown in FIG. 5C, the insulating interlayer 205 exposed from the openings 206a and 206b of the resist 206 is uniformly removed to reach the first conductive film 203 located on the lower portion of the stepped portion in accordance with known tapered RIE using the resist 206 having the predetermined pattern as a mask, thereby forming openings 207 and 208 for contact holes. After the resist 206 is removed in accordance with the known resist removal method, as shown in FIG. 5D, an aluminum film 209 for upper wiring layers is formed on the first and second conductive films 203 and 204 in the openings 207 and 208 and on the insulating interlayer 205, as shown in FIG. 5E. As shown in FIG. 5F, a resist 206 having a predetermined pattern is formed so as to have openings above the conductive film on the prospective isolation region 207a between the lower wiring layers of the first conductive film 203, the conductive film on the prospective isolation region 208a between the lower wiring layers of the second conductive film 204, and the aluminum film 209. As shown in FIG. 5G, the aluminum film 209 is partially removed on insulating interlayer portions 207a and 208a of the first and second wiring layers 203 and 204 in accordance with RIE using the resist 206 having a predetermined pattern as a mask, thereby forming upper wiring layers isolated from each other and electrically connected to the corresponding lower wiring layers. As shown in FIG. 5H, the resist 206 is removed by the known resist removal method. Insulating interlayers and conductive films are alternately formed, as needed, thereby obtaining a multilayered wiring structure.

According to the second embodiment, the stepped portion formed in the improved method of forming the multilayered wiring structure is not formed, and the aluminum film remaining portion caused by the stepped portion is not formed, either. Since the common lower wiring layers adjacent to the openings are formed, even if mask misalignment occurs in forming the openings, excessive overetching is not caused, and neither a groove nor a cavity is formed. In addition, since the opening area is large, coverage of the aluminum film is improved, and the thickness of the aluminum film on the side wall of the opening can be increased. For this reason, the sectional area of the wiring pattern is increased, the current density will not be increased, and resistance to electromigration can be increased.

Figure 6A:
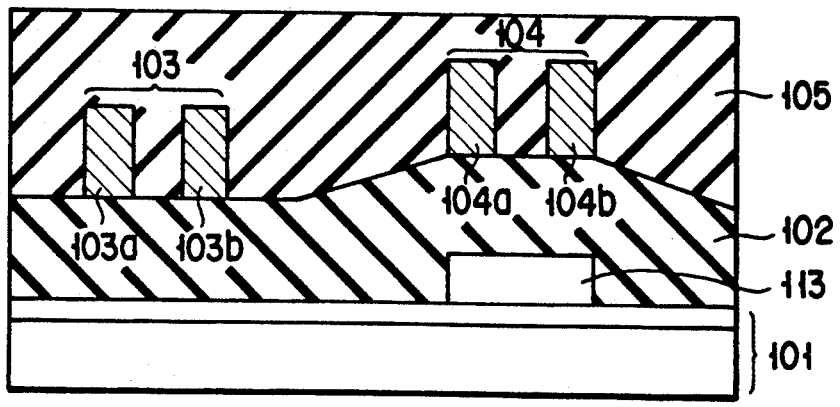
Figure 6B:
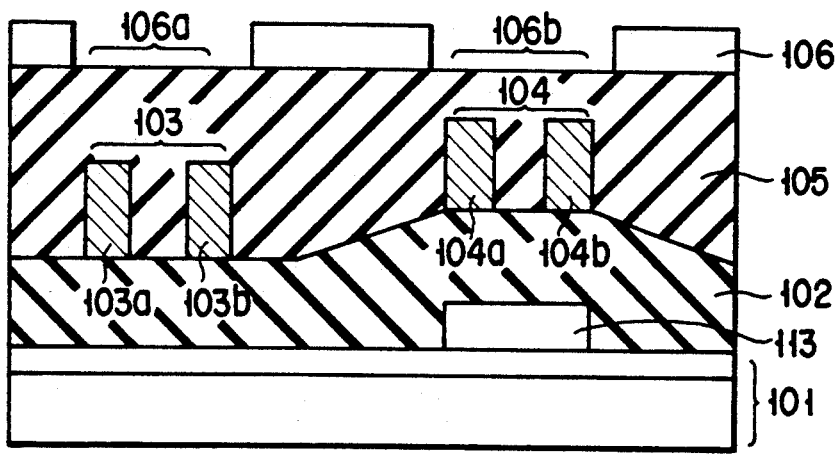
Figure 6C:
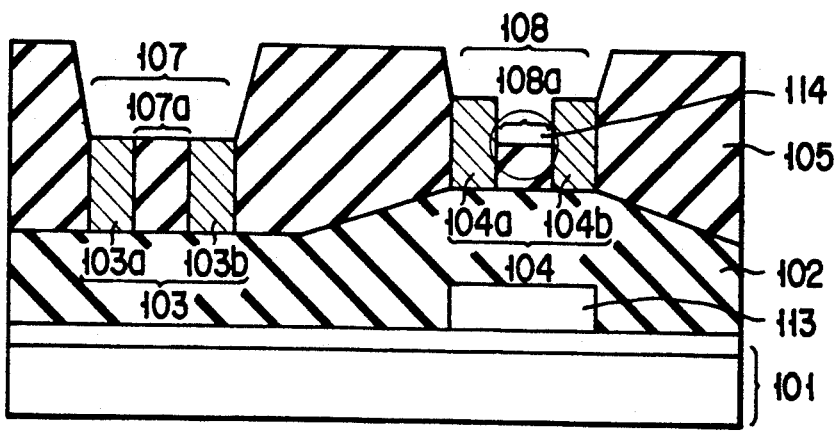
Figure 6D:
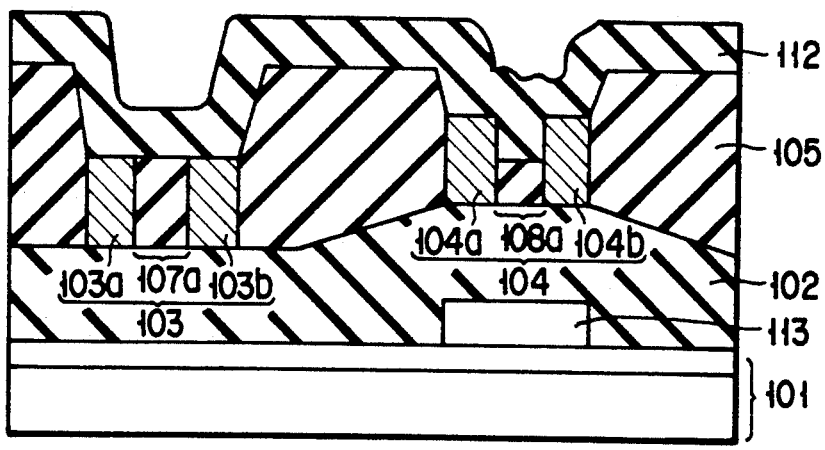
Figure 6E:
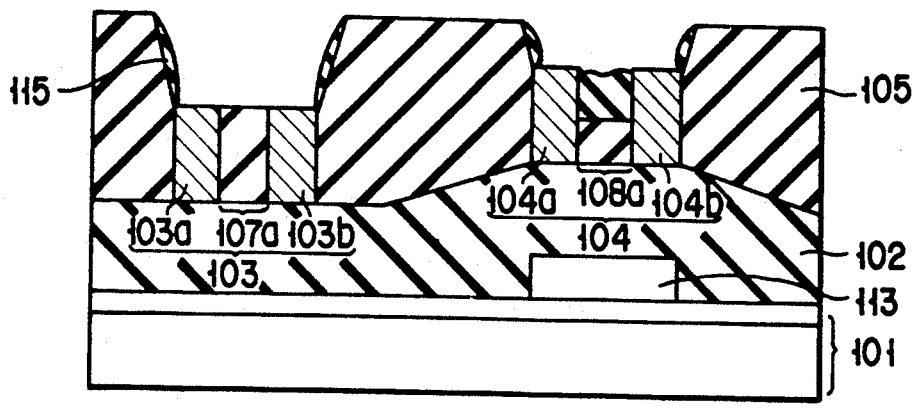
Figure 6F:
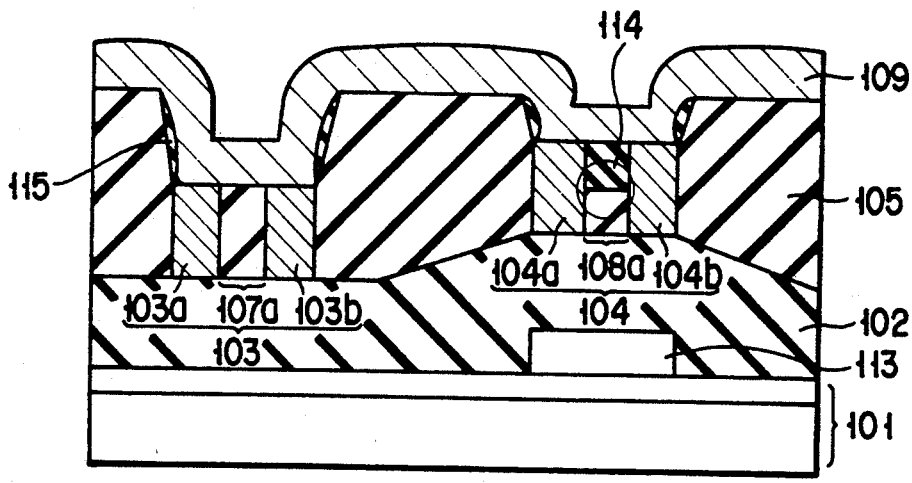

FIGS. 6A to 6I are sectional views for explaining the steps in forming a multilayered wiring structure according to the third embodiment of the present invention. A first insulating film 102 is formed on a semiconductor substrate 101 having a multilayered wiring structure and a polycrystalline semiconductor layer 113. In this embodiment, the insulating film 102 also has a stepped portion. After part of the first insulating film 102 which is required for connection with the substrate 101 is removed, an aluminum film is deposited on the entire surface of the resultant structure and is patterned. As shown in FIG. 6A, a first wiring portion 103 having at least two lower wiring layers 103a and 103b is formed on the lower portion of the stepped portion of the first insulating film 102. The lower wiring layers 103a and 103b are electrically connected and adjacent to each other. A second wiring portion 104 having at least two lower wiring layers 104a and 104b is formed on the higher portion of the stepped portion of the first insulating film 102. The lower wiring layers 104a and 104b are electrically connected and adjacent to each other. An insulating interlayer 105 is formed on the lower wiring layers 103a, 103b, 104a, and 104b of the wiring portions 103 and 104 so as to form upper wiring layers and is planarized by the known resist etch-back method. As shown in FIG. 6B, a resist 106 is formed on the insulating interlayer 105 and is formed into a predetermined pattern in accordance with the known photolithographic technique. Openings 106a and 106b of the resist 106 are formed to have sizes which cover the first wiring portion 103 having the lower wiring layers 103a and 103b and the second wiring portion 104 having the lower wiring layers 104a and 104b. As shown in FIG. 6C, the insulating interlayer 105 exposed from the openings 106a and 106b is uniformly removed to reach the first wiring portion 103 located on the lower portion of the stepped portion in accordance with known tapered RIE using the resist 106 having the predetermined pattern as a mask, thereby forming openings 107 and 108 for contact holes. At this time, a surface formed by the lower wiring layers 103a and 103b exposed in the opening 107 corresponding to the first wiring portion 103 and an insulating interlayer portion 107a between the wiring layers is almost flat. A surface formed by the lower wiring layers 104a and 104b exposed in the opening 108 corresponding to the second wiring portion 104 and an insulating interlayer portion 108a between the wiring layers has a structure having a stepped portion 114 due to the same etching depth. The stepped portion 114 of the second wiring portion 104 is formed due to the presence of the polycrystalline silicon layer 113 located below the first insulating film 102 under the second wiring portion 104. For example, assume that the polycrystalline semiconductor layer 113 has a thickness of 0.4 μm, and that the insulating interlayer at the insulating interlayer portion 107a between the lower wiring layers of the first wiring portion 103 is 1.0 μm. At this time, the insulating interlayer at the insulating interlayer portion 108a between the lower wiring layers of the second wiring portion 104 has a thickness of 0.6 μm. After the resist 106 is removed by the known resist removal method, as shown in FIG. 6D, a third insulating film 112 is formed on the first and second wiring portions 103 and 104 in the openings 107 and 108 and on the insulating interlayer 105. The third insulating film can bury the stepped portion 114 of the insulating interlayer portion 108a between the lower wiring layers 104a and 104b of the opening 108 at the second wiring portion 104. A portion between the lower wiring layers 104a and 104b of the second wiring portion 104 is constituted by an insulating film consisting of the insulating interlayer 105 and the third insulating film 112. As shown in FIG. 6E, the third insulating film 112 is removed by a known blanket etch-back method until the surfaces of the first and second wiring portions 103 and 104 are exposed. The opening 107 for the contact hole of the first wiring portion 103 and the opening 108 for the contact hole in which the stepped portion 114 of the insulating interlayer portion 108a of the second wiring portion 104 is buried by the third insulating film 112 are formed again. Side walls 115 of the third insulating film 112 are also formed in the openings 107 and 108. As shown in FIG. 6E, an aluminum film 109 for upper wiring layers is formed on the first and second wiring portions 103 and 104 in the openings 107 and 108. As shown in FIG. 6F, a resist 106 having a predetermined pattern is formed by the known photolithographic technique such that openings are formed above the insulating interlayer portion 107a between the lower wiring layers 103a and 103b of the first wiring portion 103 and above the insulating interlayer portion 108a between the lower wiring layers 104a and 104b of the second wiring portion 104. As shown in FIG. 6G, the aluminum film 109 is partially removed from the insulating interlayer portions 107a and 108a at the first and second wiring portions 103 and 104 in accordance with RIE using the resist 106 having the predetermined pattern as a mask, thereby forming upper wiring layers isolated from each other and electrically connected to the corresponding lower wiring layers. Thereafter, as shown in FIG. 6H, the resist 106 is removed by the known resist removal method. Insulating interlayers and conductive layers are alternately formed, as needed, thereby obtaining a multilayered wiring structure.

In the third embodiment, the stepped portion of the third insulating film due to the same etching depth is completely buried with the third insulating film. The aluminum residual portion which is formed in the stepped portion upon formation of the upper wiring layers in the conventional technique can be eliminated. For this reason, short-circuiting between the lower wiring layers can be prevented, the product yield can be increased, and reliability of the wiring structure can be improved. Since the side walls of the third insulating film are formed in the openings during etching, coverage of the upper wiring layers can be improved. In addition, since no groove is formed between the lower wiring layers, coverage of the insulating film formed on the upper wiring layers can be improved.

As has been described above, according to a method of forming a multilayered wiring structure, when an underlying semiconductor layer such as a polycrystalline semiconductor layer is present or a stepped portion is formed by a multilayered arrangement, unlike in the conventional method, a thin resist pattern portion need not be formed, and an ideal opening shape can be obtained, thereby further assuring isolation of the upper wiring layers. Therefore, a highly reliable multilayered wiring structure can be formed at a high yield.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a multilayered wiring structure, comprising the steps of:
   forming a first conductive film for a predetermined number of lower wiring layers on a predetermined region of a semiconductor substrate;
   forming an insulating interlayer on said semiconductor substrate including said first conductive film;
   partially removing said insulating interlayer to expose said first conductive film, thereby forming an opening;
   forming a second conductive film for upper wiring layers on said first conductive film exposed in said opening and an upper surface of said insulating interlayer, said second conductive film being in contact with said first conductive film; and
   simultaneously and selectively removing said first and second conductive films to form said upper and lower wiring layers isolated in a predetermined number within the opening.

2. A method according to claim 1, wherein the step of simultaneously and selectively removing said first and second conductive films comprises the step of self-aligning said upper and lower wiring layers using the same pattern.

3. A method according to claim 1, wherein the step of simultaneously and selectively removing said first and second conductive films comprises the step of simultaneously processing said upper and lower wiring layers.

4. A method according to claim 1, wherein the opening is formed as a via hole.

5. A method according to claim 1, wherein a length of a prospective isolation region between said lower wiring layers is not more than about 2 μm.

6. A method according to claim 1, wherein the opening includes at least two lower wiring layers.

7. A method of forming a multilayered wiring structure of a semiconductor device, comprising the steps of:
   forming a plurality of first conductive films each for a predetermined number of lower wiring layers in a predetermined region of a first stepped insulating film formed on a semiconductor substrate;
   forming an insulating interlayer on said semiconductor substrate including said plurality of first conductive films;
   partially removing said insulating interlayer until one of said plurality of first conductive films which is located at a lowest position is exposed, thereby forming a plurality of openings;
   forming a second conductive film for upper wiring layers on said insulating interlayer including said plurality of first conductive films, said second conductive film being in contact with said first conductive films; and simultaneously and selectively removing said first and second conductive films to form the upper and lower wiring layers each in a predetermined number within each opening.

8. A method according to claim 7, wherein the step of simultaneously and selectively removing said first and second conductive films comprises the step of self-aligning said upper and lower wiring layers using the same pattern.

9. A method according to claim 7, wherein the step of simultaneously and selectively removing said first and second conductive films comprises the step of simultaneously processing said upper and lower wiring layers.

10. A method according to claim 7, wherein the opening is formed as a via hole.

11. A method according to claim 7, wherein an interval between said lower wiring layers is not more than about 2 $\mu$m.

12. A method according to claim 7, wherein a length of a prospective isolation region between said lower wiring layers is not more than about 2 $\mu$m.

13. A method of forming a multilayered wiring structure of a semiconductor device, comprising the steps of:
    forming first and second wiring portions each having a predetermined number of lower wiring layers electrically insulated from each other and adjacent to each other, said first and second wiring portions being formed on a first stepped insulating film formed on a semiconductor substrate;
    forming an insulating interlayer on said semiconductor substrate including said first and second wiring portions;
    planarizing an upper surface of said insulating interlayer;
    partially removing said insulating interlayer until said first and second wiring portions are exposed, thereby forming first and second openings;
    forming a second insulating film on exposed surfaces of said first and second wiring portions;
    removing said second insulating film while leaving said second insulating film between lower wiring layers of said second wiring portion such that said second insulating film has the same level as that of said lower wiring layers;
    forming the first and second openings for exposing said first and second wiring portions again;
    forming a conductive film for upper wiring layers on an upper surface of said insulating interlayer including said first and second wiring portions such that said conductive film is in contact with said first and second wiring portions; and
    selectively removing said conductive film located between said lower wiring layers to form isolated upper and lower wiring layers each in a predetermined number within the first and second openings.

14. A method according to claim 13, wherein the first and second openings are via holes having the same depth.

15. A method according to claim 13, wherein the step of removing said second insulating film comprises the step of etching back an entire surface.

16. A method according to claim 15, further comprising the step of forming side walls in the openings simultaneously with the step of etching back said entire surface.

* * * * *